United States Patent [19]

Myers

[11] 4,293,625

[45] Oct. 6, 1981

[54] ANCHOR LAYER IN PHOTOLITHOGRAPHIC RECEPTOR BASE CONTAINS OXIDE SURFACE TREATED TITANIUM DIOXIDE

[75] Inventor: Joseph F. Myers, Lake Elmo, Minn.

[73] Assignee: Minnesota Mining and Manufacturing Company, Saint Paul, Minn.

[21] Appl. No.: 197,198

[22] Filed: Oct. 15, 1980

Related U.S. Application Data

[63] Continuation of Ser. No. 782,174, Mar. 28, 1977, abandoned.

[51] Int. Cl.$^3$ .................................................. G03C 1/04
[52] U.S. Cl. ...................................... 430/9; 430/207; 430/523; 430/531; 430/533; 430/631; 428/309; 428/328; 428/329

[58] Field of Search ............... 430/523, 531, 533, 631, 430/9; 428/309, 328

[56] References Cited

U.S. PATENT DOCUMENTS 3,914,125 10/1975 Eikvar ................................. 427/144

*Primary Examiner*—John D. Welsh
*Attorney, Agent, or Firm*—Cruzan Alexander; Donald M. Sell; Gerald F. Chernivec

[57] ABSTRACT

Photolithographic receptor sheet comprising a support having an anchor layer thereon comprising rutile crystalline titanium dioxide having an oxide surface treatment of at least about 10 percent by weight, the major proportion of which is the oxide of silica, and a layer of hydrophilic colloidal silica overlying said anchor layer.

15 Claims, No Drawings

ANCHOR LAYER IN PHOTOLITHOGRAPHIC RECEPTOR BASE CONTAINS OXIDE SURFACE TREATED TITANIUM DIOXIDE

This is a continuation application Ser. No. 782,174 filed Mar. 28, 1977, now abandoned.

BACKGROUND OF THE INVENTION

This invention relates to lithographic printing, and more particularly to a photolithographic image receptor sheet hving specific utility in silver salt diffusion transfer imaging systems.

Planographic printing plates typically contain a substrate having a hydrophilic coating thereon, the oleophilic or ink receptive image areas subsequently being produced directly on the hydrophilic surface. Various light-sensitive materials can be utilized to prepare such image areas, e.g., diazo resins, silver halide emulsions, cinnamic acid esters, etc.

One system having specific utility herein involves preparation of photographic images of silver by diffusion transfer principles, which are generally well known in the art. Typically, an imagewise exposed silver halide emulsion is contacted with a processing composition containing a developing agent to reduce the exposed silver halide to silver in the emulsion and a silver halide solvent which is capable of providing a soluble silver complex with the unexposed silver halide. An imagewise distribution of this silver complex is then transferred to a superposed silver-receptive stratum where it is reduced to metallic silver to impart to the surface thereof a silver transfer image.

Diffusion transfer has been employed in connection with photolithography by utilizing a hydrophilic material as the silver receptive stratum (to thereby provide the background of the printing plate). The silver image is then used to generate an ink-receptive printing surface on the hydrophilic background. In such a system, the hydrophilic silver-receptive stratum of the receptor sheet contains silver-precipitating nuclei disbursed in a macroscopically continuous vehicle or matrix. One such matrix having particular utility is colloidal silica, the silver being deposited imagewise on the silica surface to provide the ink-receptive image areas of the plate. The silver image areas can subsequently be chemically processed to render same oleophilic, i.e., ink-receptive.

Colloidal silica has conventionally been utilized for background areas, i.e., the hydrophilic areas of printing plates, because silica optimizes the hydrophilicity thereof, most organic materials being less hydrophilic than silica and therefore tending to produce a printing plate which may scum or accept ink in the background areas more readily than those wherein silica is utilized. U.S. Pat. No. 3,055,295 discusses the utility of silica in connection with polymers and a hardener therefor to produce printing plates. U.S. Pat. No. 3,736,872 improves thereon by utilizing self-hardening polymers therewith, and U.S. Pat. No. 3,922,441 discusses the utility of positively-charged silica in printing plate structures. A major improvement thereover is disclosed in Boston et al U.S. application Ser. No. 504,244, abandoned and refiled as Ser. No. 890,313, also abandoned, wherein it is disclosed that by utility of different silica particle sizes, an optimum of strength and imaging characteristics can be achieved without necessity of utilizing additional organic polymers in the layer.

In the foregoing constructions, attention has typically centered on improvement of the hydrophilic surface and adhesion of silver thereto, with little or no attention directed to how the hydrophilic silica layer itself is anchored to the supporting substrate or backing. I have discovered that by incorporating hereinafter defined titanium dioxide materials in an anchor layer, a dramatic increase in press life is attained over the heretofore discussed constructions due to increased adhesion of the hydrophilic silica layer to the plate backing.

SUMMARY OF THE INVENTION

In accordance with the invention there is provided a hydrophilic-surfaced photolithographic receptor sheet comprising a support having an anchor layer thereon, said anchor layer comprising rutile crystalline titanium dioxide having an oxide surface treatment of at least about 10 percent by weight, the major proportion of which is the oxide of silica, and a hydrophilic colloidal silica layer over said anchor layer.

By using the defined titanium dioxide anchor layer, excellent adhesion of the silica layer thereto results, affording extended press life to a lithographic plate prepared with the receptor sheet.

DETAILED DESCRIPTION OF THE INVENTION

When colloidal silicas are utilized as the hydrophilic layer in a planographic printing plate construction, the silica solution can of course be coated directly onto a substrate, e.g., polyester, and dried, but upon conventional subsequent processing, it is observed that the silica layer is bonded so lightly to the polyester film that a majority of the silica can be easily removed therefrom. It is obviously necessary, therefore, to provide increased adhesion of the hydrophilic silica surface. In U.S. Pat. No. 3,914,125 there is disclosed an adhesion layer for anchoring the hydrophilic silica layer to the polyester substrate. In accordance therewith, the adhesion layer is coated onto the substrate from a solution containing a vinyl-chloride-acetate resin and a titanium dioxide pigment in a ratio of 2.65 parts of titanium dioxide pigment per part by weight of resin. While such a construction provides significant increase in the adhesion of the overlying colloidal silica layer to the substrate, it has been ascertained that the choice of titanium dioxide pigment can increase this degree of adhesion tremendously over that disclosed previously.

Titanium dioxide pigments are white, odorless, inert, non-toxic powders which are insoluble in most solvents except concentrated sulfuric and hydrofluoric acids. There are two crystalline forms of titanium dioxide which are of commercial importance, these being anatase and rutile. Most modern titanium dioxide pigments are constructed of a crystalline base of the rutile form which has been coated with a layer of hydrous oxide, the oxide typically being of aluminium, silica or titanium. Such coatings, or surface treatments on the crystalline titanium dioxide particles are deposited from solutions of compounds such as sodium silicate, which can be added to an aqueous dispersion of the pigment base by neutralization. They are usually a mixture of two or more oxides (hydroxides); commonly alumina, silica and titania. Because the pigments rarely experience temperatures greater than 160° C. during post-coating processing, the coating or surface treatment thereon is fully hydrated and is amorphous rather than crystalline in nature. The coating is typically from 40 to 50 Angstroms in thickness and is transparent.

The titanium dioxide having particular utility in my invention is the rutile crystalline type having a surface treatment exceeding about 10% by weight of the particles, and more preferably about 15%, which includes the oxide of silica as a principal ingredient. The following table presents various silicas together with their surface oxide treatment and the relationship thereto to adhesion of an overlying colloidal silica hydrophilic layer.

TABLE I

| Material[1] | Percent by Weight T:02 | Surface Oxide | Adhesion of silica overlayer[2] |
|---|---|---|---|
| Titanox 2062 | 94 | Al, Si, Zn | Poor |
| Unitane OR 342 | 97 | Al | Poor |
| Unitane OR 350 | 97 | Al | Good |
| Unitane OR 560 | 90 | Al, Si | Better |
| Titanox 2030 | 85 | Al, Si | Better |
| Tronox CR 812 | 90 | Al, Si | Better |
| Tronox CR 813 | 87 | Al, Si | Better |
| R 931 | 85 | Al, Si | Best |
| Titanox 2131 | 83 | Al, Si | Best |
| Unitane OR 572 | 83–85 | Al, Si | Best |
| Unitane OR 573 | 80 | Al, Si | Best |

[1]Titanox is a tradename of National Lead Industries; Unitane is a tradename of American Cyanamide; Tronox is a tradename of Kerr. McGee Chem.; R-931 is a DuPont pigment
[2]As determined by press testing in accordance with Example 1.

From the foregoing table it can be appreciated that the mere presence of silica in the surface treatment of the titanium dioxide is not sufficient for increased adhesion, but rather that a high percentage surface treatment, which is primarily the oxide of silica, is necessary.

In the formation of silica gels, it has been hypothesized that the basic step occurring therein is the collision of two silica particles, contact being required to allow the formation of siloxane bonds which typically hold the particles together irreversably. While not wishing to be limited by theory, it is likely that the increase in press life observed with the silica oxide-treated titanium dioxide pigments is due to the similar formation of siloxane bonds, whereas such bonds are unlikely, or appear to be unlikely, with aluminum, zinc or titania surface treatments.

To further illustrate my invention more specifically, the following non-limiting examples are provided, wherein all parts are by weight unless otherwise specified.

EXAMPLE 1

A 4-mil (100 micron) polyethylene terephthalate film was coated on one surface from a methyl ethyl ketone solution containing Union Carbide's "Vinylite VAGH" vinyl chloride-acetate resin and dispersed American Cyanamide's "Unitane" OR 572 (designated to have 83% $TiO_2$ with $Al_2O_3$ and $SiO_2$) pigment (designated to have 17 percent by weight surface treatment of $Al_2O_3$ and $SiO_2$) in a ratio of 3 parts OR 572 to 1 part by weight of resin and dried at 200° F. to provide a dry coating weight of 1.2 grams per square foot.

The thus coated sheet was treated to improve the hydrophilic or wetting characteristics of the surface by passing the film through a corona discharge.

The sheet was then overcoated with a hydrophilic silica layer of the following composition:

"Nyacol" 2040 Colloidal Silica: 317 g

"Nalco" 1115 Colloidal Silica: 23 g
Merck's Silver Protein Mild at 10% Solids in Water: 20 ml to provide a dry coating weight of 0.5 grams per square foot.

After allowing the coated sheet to cure for several days at room temperature, a high contrast chlorobromide photographic emulsion having a chloride/bromide ratio of 2:1 and a gelatin/silver ratio of 1.2:1 was coated over the hydrophilic silica layer to provide a silver coating weight of 2.0 grams per square meter.

A 10 inch by 15 inch sheet of the above material was conventionally exposed in a camera equipped with a reversal prism and photographically developed with a conventional diffusion transfer developer having the following composition:

| Ingredient | Amount |
|---|---|
| Deionized Water | 1000 milliliters |
| Sodium Sulfite | 80 grams |
| Hydroquinone | 35 grams |
| Sodium Thiosulfate | 15 grams |
| Sodium Hydroxide | 28.5 grams |
| Potassium Bromide | 2.5 grams |
| 0.5% Benzotriazole in Water | 25 milliliters |

After washing the emulsion off with warm water, a positive, right-reading copy of the original was obtained on the sheet material.

The sheet was then immersed for 25 seconds at room temperature in a solution of the following composition:

| Ingredient | Amount |
|---|---|
| Potassium Ferricyanide | 33.0 grams |
| Sodium Chloride | 17.5 grams |
| 2-Benzyl-2-Imidazoline Hydrochloride | 10 grams |
| Deionized Water | Enough to make 1 liter |

This material conditions the silver image areas so as to be lithographically functional, i.e., ink receptive.

After water washing the sheet material for 10 seconds and drying, the sheet was mounted onto an "ATF Chief" 15 printing press with conventional ink and fountain solution, whereupon over 30,000 good quality copies were prepared with no deterioration in image quality.

In accordance with the teachings of Boston et al application Ser. No. 504,244, a mixture of two different sizes of colloidal silica was utilized to provide the hydrophilic silica coating.

Most of the silica sols available commercially are characterized as consisting of discrete spheroidal particles within a fairly narrow size range distribution. At least one commercial sol, that being Nalco Chemical's "Nyacol" 2040, consists of particles which, when viewed under an electron microscope at high magnification, reveal that the particles are in fact irregular in shape and appear to dry in an interlocking fashion. It is believed that the irregularly shaped silica particles produce plates having increased press life.

As is foreseen in the above example, a large number of copies must be prepared prior to observance of plate breakdown. Therefore, the following two examples utilized conditions which are merely illustrative of relative press life, i.g., the examples are designed to provide an accelerated plate breakdown. To accomplish this purpose, the silica coatings were relatively thin, e.g., around 80 milligrams per square foot, and an overpacked press was utilized, i.e., one utilizing a thicker press blanket to increase pressure and thus plate wear.

EXAMPLE 2

Printing plates were prepared as per Example 1 with the exception that the following titanium dioxide pigments were used in the anchor coating.

| Titanium Dioxide | % TiO$_2$ | Surface Oxide | Relative Press life |
|---|---|---|---|
| Unitane[1] OR 350 | 97 | Al | 3000 |
| Unitane OR 342 | 97 | Al | 2700 |
| Unitane OR 560 | 90 | Al, Si | 4400 |

[1]Unitane is a commercial designation of American Cyanamide Co.

EXAMPLE 3

When Example 2 was repeated with another series of pigments the following results were obtained:

| Titanium Dioxide[1] | % TiO$_2$ | Surface Oxide | Press life |
|---|---|---|---|
| Unitane OR 560 | 90 | Al, Si | 5000 |
| Tronox CR 813 | 87 | Al, Si | 4500 |
| Unitane OR 572 | 85 | Al, Si | 6000 |

[1]Unitane is a commercial designation of American Cyanamide; Tronox is a commercial designation of Kerr McGee Chem.

EXAMPLE 4

A series of press runs were made, the plates being prepared as per Example 1, except that the silica coating weight was varied.

In the first series, Nalcoag 1050, tradename for a colloidal silica having spherically shaped particles, was substituted for the Nyacol 2040 and Unitane OR 560 titanium dioxide pigment was substituted for the Unitane OR 572. Results were as follows:

| Silica coating weight, mg. per square foot | Press Life, no. of copies |
|---|---|
| 61 | 4,000 |
| 123 | 6,000 |
| 323 | 11,000 |
| 333 | 11,000 |
| 470 | 9,000 |
| 619 | 2,000 |

In the second series, Example 1 was duplicated exactly, with silica coating weights being varied. Results were as follows:

| Silica coating weight, mg. per square foot | Press Life, no. of copies |
|---|---|
| 152 | 8,500 |
| 233 | 17,000 |
| 368 | 22,000 |
| 489 | 36,000 |
| 548 | 25,000 |
| 711 | 4,000 |
| 891 | 3,000 |

As illustrated, when a thin silica layer is coated (approx. 100 mg. per square foot) on the anchor layer, poor press life results. This is not surprising, since the anchor coating is not flat, but rather has a hill and valley appearance under high magnification. The silica layer is flat, however, and is thus thick in some areas and very thin in others and hence easily worn away or abraded in the very thin areas.

Likewise poor press life results when very thick layers of silica (around 600 mg per square foot or above) are coated, because they dry in a "mud cracked" fashion, with the silica columns turning back to powder form which is easily removed by even a brush of the hand across the layer.

In contrast to these conditions, a dense, hard coherent hydrophilic layer is formed at coating weights around 200-500 mg. per square foot and it is in this region that the major difference between the interaction of the colloidal silica sol and the surface treated titanium dioxide pigment is observed. As illustrated in the last Example, by using the non-spheroidal silica, along with a titanium dioxide which has a very high percentage of surface silica, a press life is observed which is up to 3 times longer than that obtained when conventional spheroidal particles are used, even with pigments which contain some silica in the surface. This discovery results in a printing plate which is as economical to produce as conventional plates, but has the added advantage that very durable plates can be produced which are capable of producing good press copies measured in tens of thousands. In addition, no significant change is made in the silicas used in the hydrophilic layer, i.e., appearance and image quality are not affected.

EXAMPLE 5

One disadvantage of a white plate (produced when nly titanium dioxide is used in the anchor layer) is that when a photographic emulsion is overcoated and imaged, light scattering is severe and results in a reduction in resolution quality of the photographic image. A simple way to improve the image resolution without increasing the complexity of the plate is to incorporate a dye or carbon black into the anchor layer. In this Example, everything was repeated as per Example 1 except that 1 gram of Sterling R Carbon Black was added per 90 grams of titanium dioxide pigment before milling.

When the coating was made and the plate subsequently produced, a black image on a grey background resulted. The grey background had a reflected optical density of 0.52, compared to the white background which had a reflected optical density of 0.10. The net result was an antihalation background which required an increase in exposure time of 40% over the white plate, but provided a significant increase in image resolution.

EXAMPLE 6

When Example 5 was repeated with a red dye (soluble in the methyl ethyl ketone but insoluble in water) replacing the carbon black, a plate was produced which had a black image on a pink background. The dye used was Celliton Fast Pink RF-HT from the GAF Corporation, but any dye could be used which is not water soluble and absorbs the light which an ortho-chromatic emulsion is sensitized for (blue and green). The exposure required here was nearly double that for the white plate, while resolution was about equal to that found with the grey base.

What is claimed is:

1. A hydrophilic-surfaced photolithographic receptor sheet comprising a support having an anchor layer thereon, said anchor layer comprising a dispersion of rutile crystalline titanium dioxide in a binder resin, said titanium dioxide having an oxide surface treatment of at least about 10 percent by weight, said oxide surface treatment comprising the oxides of silica and alumina, the major proportion thereof being the oxide of silica, and overlying said anchor layer a hydrophilic layer comprising hydrophilic colloidal silica, said hydrophilic layer having a coating weight of from about 200 to about 500 milligrams per square foot.

2. The receptor sheet of claim 1 wherein said hydrophilic layer comprises substantially nonspheroidal silica particles.

3. The receptor sheet of claim 1 wherein said oxide surface treatment is at least about 15 percent by weight.

4. The receptor sheet of claim 1 wherein said anchor layer contains a colorant therein.

5. The receptor sheet of claim 4 wherein said colorant is carbon black.

6. A light-sensitive photolithographic printing plate capable of being imaged by the silver salt diffusion transfer process comprising a support having an anchor layer thereon, said anchor layer comprising a dispersion of rutile crystalline titanium dioxide in a binder resin, said titanium dioxide having an oxide surface treatment of at least about 10 percent by weight, said oxide surface treatment comprising the oxides of silica and alumina, the major proportion thereof being the oxide of silica, and overlying said anchor layer a hydrophilic layer comprising hydrophilic colloidal silica, and overlying said hydrophilic layer a light-sensitive layer, comprising a silver halide emulsion.

7. The receptor sheet of claim 6 wherein said hydrophilic layer comprises substantially nonspheroidal silica particles.

8. The receptor sheet of claim 6 wherein said oxide surface treatment is at least about 15 percent by weight.

9. The receptor sheet of claim 6 wherein said anchor layer contains a colorant therein.

10. The receptor sheet of claim 9 wherein said colorant is carbon black.

11. A lithographic printing plate prepared by the silver salt diffusion transfer process comprising a support having an anchor layer thereon, said anchor layer comprising a dispersion of rutile crystalline titanium dioxide in a binder resin, said titanium dioxide having an oxide surface treatment of at least about 10 percent by weight, said oxide surface treatment comprising the oxides of silica and alumina, the major proportion thereof being the oxide of silica, and overlying said anchor layer a hydrophilic layer comprising hydrophilic colloidal silica, and ink-receptive image areas on said hydrophilic layer comprising metallic silver, said metallic silver having been placed on said hydrophilic layer in an imagewise fasion by silver salt diffusion transfer.

12. The receptor sheet of claim 11 wherein said hydrophilic layer comprises substantially non-spheroidal silica particles.

13. The receptor sheet of claim 11 wherein said oxide surface treatment is at least about 15 percent by weight.

14. The receptor sheet of claim 11 wherein said anchor layer contains a colorant therein.

15. The receptor sheet of claim 14 wherein said colorant is carbon black.

* * * * *